(12) United States Patent
Azumi

(10) Patent No.: US 11,714,105 B2
(45) Date of Patent: Aug. 1, 2023

(54) SOCKET AND INSPECTION SOCKET

(71) Applicant: Enplas Corporation, Saitama (JP)

(72) Inventor: Leo Azumi, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 17/216,748

(22) Filed: Mar. 30, 2021

(65) Prior Publication Data
US 2022/0317151 A1 Oct. 6, 2022

(51) Int. Cl.
*G01R 1/04* (2006.01)
*H01R 33/76* (2006.01)
*H01R 12/72* (2011.01)
*H01R 107/00* (2006.01)

(52) U.S. Cl.
CPC ......... *G01R 1/0466* (2013.01); *H01R 12/727* (2013.01); *H01R 33/7635* (2013.01); *G01R 1/0483* (2013.01); *H01R 2107/00* (2013.01); *H01R 2201/20* (2013.01)

(58) Field of Classification Search
CPC .. G01R 1/0466; G01R 1/0483; H01R 12/727; H01R 33/7635; H01R 2107/00; H01R 2201/20
See application file for complete search history.

(56) References Cited

U.S. PATENT DOCUMENTS

| | | | | | |
|---|---|---|---|---|---|
| 6,156,484 | A | * | 12/2000 | Bassous | G01R 1/06738 430/318 |
| 2002/0197891 | A1 | * | 12/2002 | Suematsu | G01R 1/0466 439/71 |
| 2004/0036493 | A1 | * | 2/2004 | Miller | G01R 31/2889 324/754.14 |
| 2005/0215086 | A1 | * | 9/2005 | Sato | H01L 23/49811 257/E23.068 |
| 2007/0281515 | A1 | * | 12/2007 | Hsiao | H01R 13/2421 439/83 |
| 2014/0253153 | A1 | | 9/2014 | Blick et al. | |
| 2014/0253163 | A1 | | 9/2014 | Suzuki et al. | |
| 2017/0171985 | A1 | * | 6/2017 | Takahashi | G01R 1/0466 |
| 2018/0275167 | A1 | * | 9/2018 | Nagata | H01R 12/7005 |
| 2019/0361050 | A1 | * | 11/2019 | Felici | G01R 1/0735 |

FOREIGN PATENT DOCUMENTS

JP 2014-169887 9/2014

* cited by examiner

*Primary Examiner* — Paresh Patel

(57) ABSTRACT

A socket electrically connects a first electric component and a second electric component, including: a base part in which a through hole extending through the base part from a top surface to a bottom surface in a vertical direction is formed; a contact pin inserted to the through hole such that a pin lower end is exposed from the bottom surface, and configured such that, when in use, a pin upper end makes contact with the first electric component; and a sheet member including a through electrode extending therethrough in the vertical direction, disposed at the base part in a state where the sheet member faces the bottom surface, and configured such that, when in use, an upper end of the through electrode makes contact with the pin lower end and a lower end of the through electrode makes contact with the second electric component.

7 Claims, 7 Drawing Sheets

SOCKET AND INSPECTION SOCKET

TECHNICAL FIELD

The present invention relates to a socket and an inspection socket.

BACKGROUND ART

In the related art, IC sockets have been known as sockets for electrically connecting electrical components such as so-called IC packages, which are packaged integrated circuits (ICs), to external electrical components. IC sockets are used, for example, to inspect the electrical characteristics of electrical components during shipping inspection.

The IC socket has a contact pin in the base part for electrical connection between the electrical component and an external electrical component (e.g., a wiring board). The electrical component is placed on the top surface side of the base part, and the wiring board is attached to the bottom surface side of the base part. The contact pins are held so that they are sandwiched between the upper housing on the upper side and the lower plate on the lower side, which constitute the base part, and the upper end of the contact pins are exposed from the upper surface of the base part and the lower end of the contact pins are exposed from the lower surface of the base part. In this manner, the contact pins are provided to extend through the base part for electrical connection between the electrical components and the wiring board (see, for example, PTL 1). The wiring board is also provided with electrodes protruding from the surface of the board for electrical connection with the lower end of the contact pins.

CITATION LIST

Patent Literature

PTL 1
Japanese Patent Application Laid-Open No. 2014-169887

SUMMARY OF INVENTION

Technical Problem

In the known socket described above, there is a risk of damaging the lower end of the contact pin by applying unintended force to the lower end of the exposed contact pin through the wiring board when attaching the wiring board, which is an external electrical component, to the lower surface side of the base part. For example, there is a risk of damaging the lower end of the contact pins by catching the lower end of the exposed contact pins at the electrodes of the wiring board during alignment when attaching the wiring board to the lower surface of the base part.

An object of the present invention is to provide a socket and an inspection socket that can protect a contact pin exposed from the bottom surface side of a base part from damage when attaching an electric component to the bottom surface side.

Solution to Problem

A socket according to an embodiment of the present invention is configured to electrically connect a first electric component and a second electric component, the socket including: a base part in which a through hole extending through the base part from a top surface to a bottom surface in a vertical direction is formed; a contact pin inserted to the through hole such that a pin lower end is exposed from the bottom surface, and configured such that, when in use, a pin upper end makes contact with the first electric component; and a sheet member including a through electrode extending therethrough in the vertical direction, disposed at the base part in a state where the sheet member faces the bottom surface, and configured such that, when in use, an upper end of the through electrode makes contact with the pin lower end and a lower end of the through electrode makes contact with the second electric component.

An inspection socket according to an embodiment of the present invention is configured to be used for inspection of electrical characteristics of the first electric component, the inspection socket including the above-mentioned socket.

Advantageous Effects of Invention

According to the present invention, it is possible to protect a contact pin exposed from the bottom surface side of a base part from damage when an electric component is attached to the bottom surface side.

DESCRIPTION OF EMBODIMENTS

An embodiment of the present invention is elaborated below with reference to the accompanying drawings.

In the present embodiment, as an example of a socket, an inspection socket for an inspection device for inspecting the electrical characteristics of an electric component is described. With this inspection device, various tests are performed on an electric component to be inspected. For example, in the same environment as the actual use condition of the electric component or in an environment with a larger load than in the actual environment, whether the electric component properly operates and the like are examined.

In addition, while the socket according to the present embodiment is an IC socket intended for inspection of IC packages, the electric component to be inspected with the socket may be an electric component different from IC packages. IC is an electronic circuit, and includes, for example, a transistor, a resistor, a capacitor and an inductor mutually connected on a silicon substrate.

Figure 1:
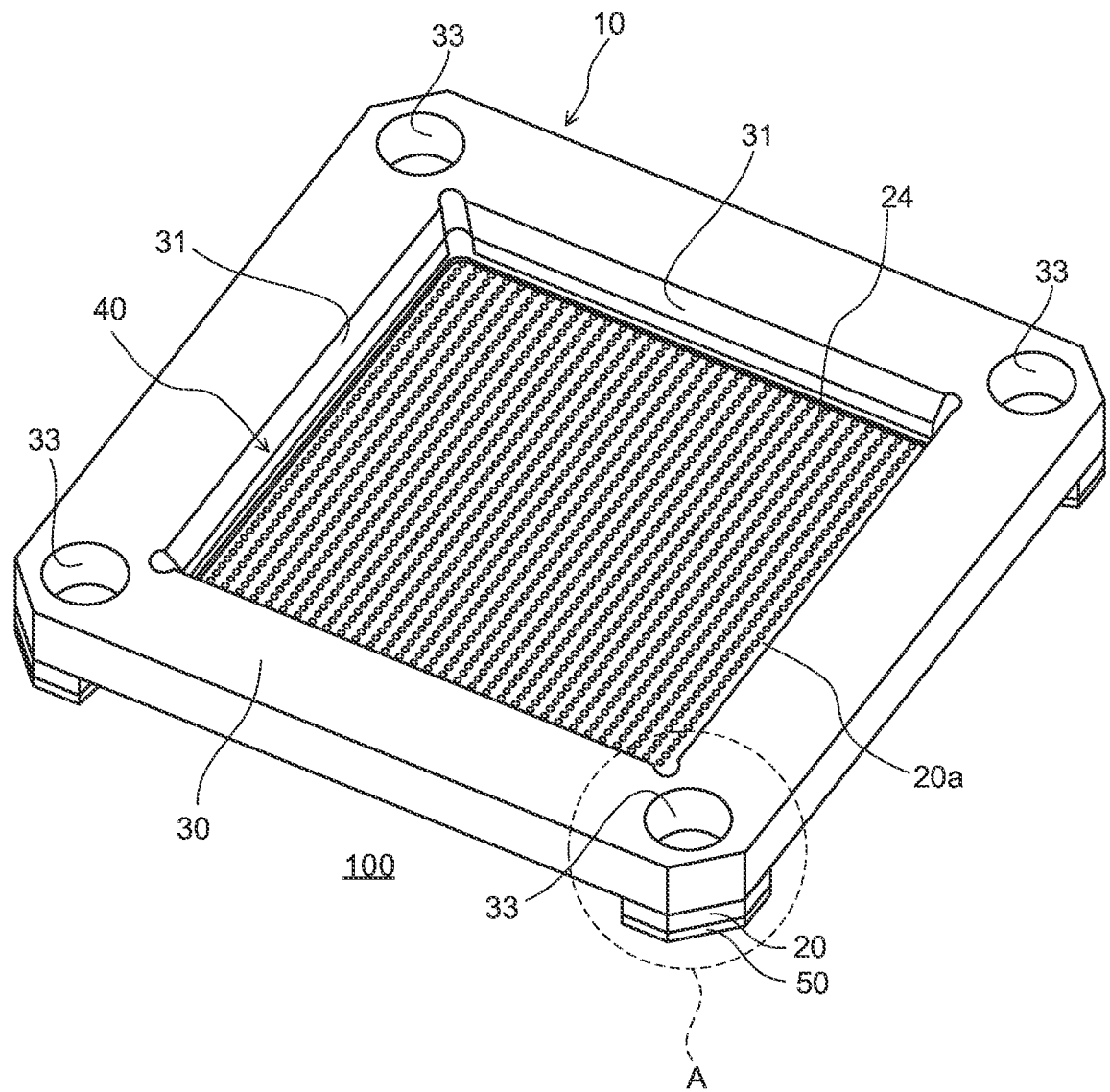
FIG. 1 is a perspective view illustrating a socket and a wiring board according to an embodiment of the present invention, and illustrating a top surface side of the socket.
Figure 2:
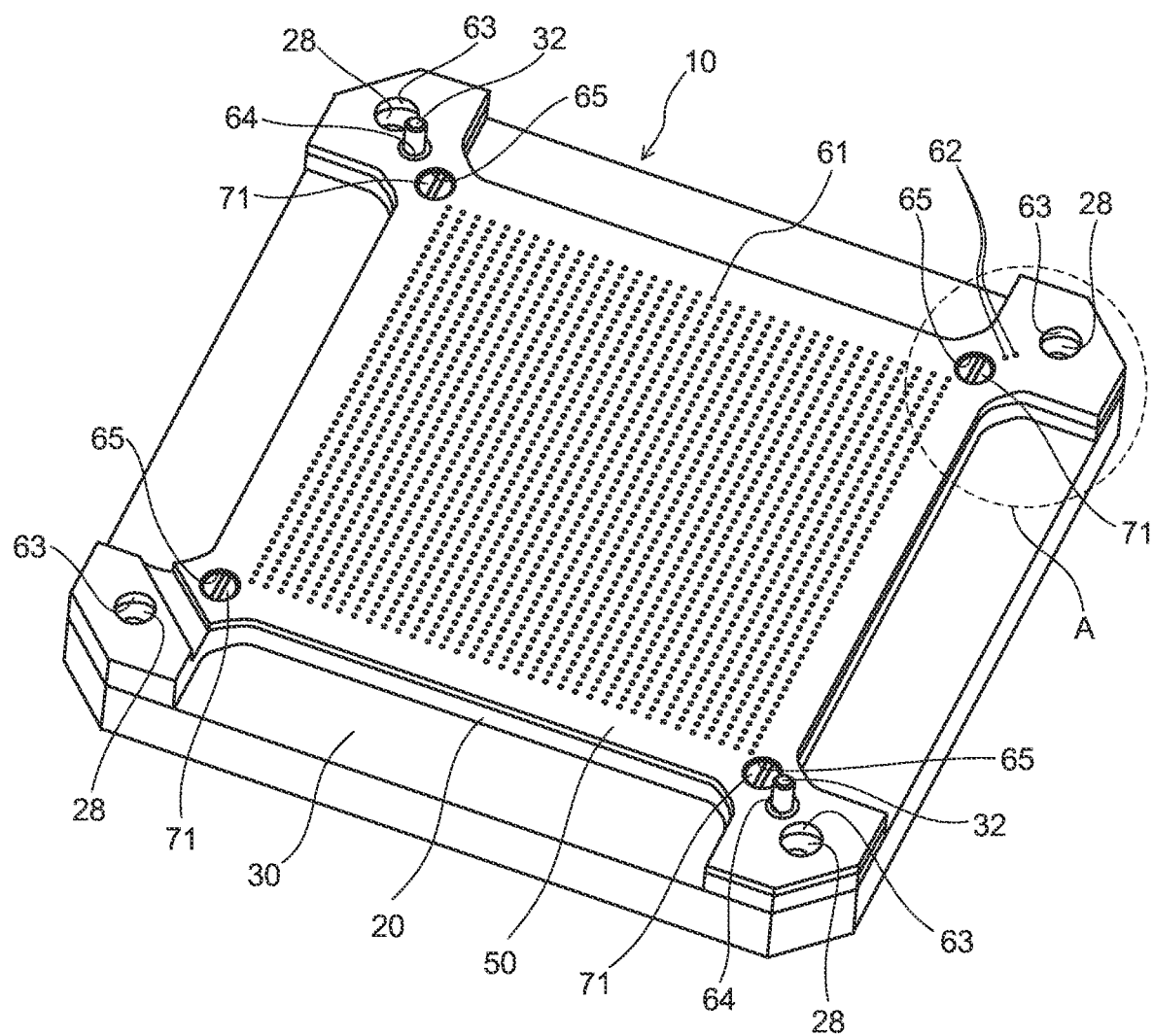
FIG. 2 is a perspective view illustrating a bottom surface side of the socket illustrated in FIG. 1.

FIG. 1 is a perspective view illustrating IC socket 10 and wiring board 100 according to the present embodiment, and illustrating the top surface side of IC socket 10. FIG. 2 is a perspective view illustrating the bottom surface side of IC socket 10 illustrated in FIG. 1. Note that FIG. 2 illustrates a state where wiring board 100 is detached from IC socket 10.

Figure 3:
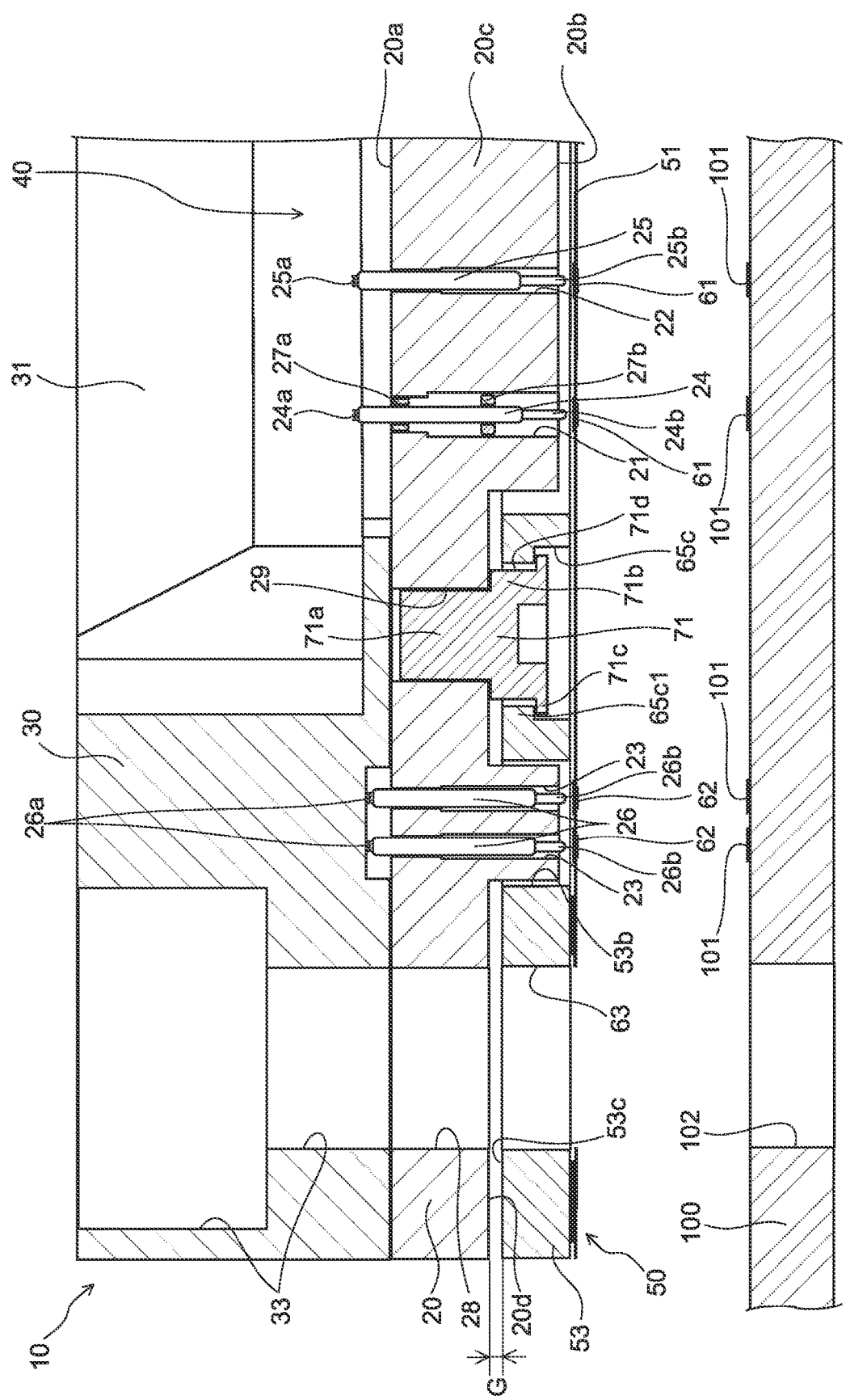
FIG. 3 is a sectional view of corner A of the socket illustrated in FIGS. 1 and 2, in a state before a wiring board is attached to the socket.
Figure 4:
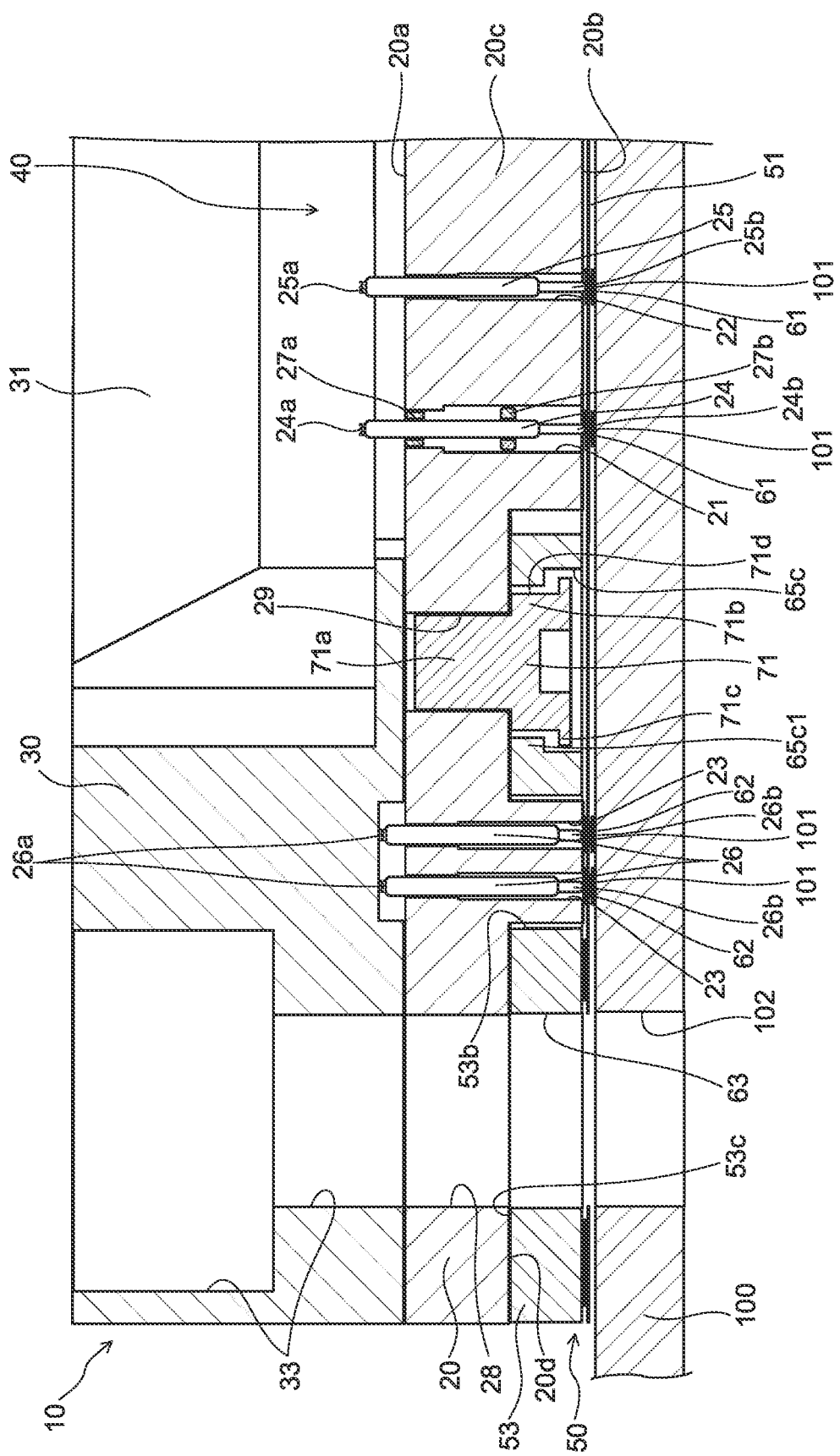
FIG. 4 is a sectional view of corner A of the socket illustrated in FIGS. 1 and 2, in a state where a wiring board is attached to the socket.

In addition, FIGS. 3 and 4 are sectional views of corner A of IC socket 10 illustrated in FIGS. 1 and 2, FIG. 3 is a drawing illustrating a state before wiring board 100 is attached to IC socket 10, and FIG. 4 is a drawing illustrating a state after wiring board 100 is attached to IC socket 10.

IC Socket

IC socket 10 includes base part 20 for placing electric components (omitted in the drawing) such as IC packages, and frame part 30 disposed outside top surface 20a of base part 20. The inside of frame part 30 is configured as housing part 40 for housing electric components.

Base Part

Base part 20 is, for example, a flat member with a predetermined thickness, and constitutes the bottom portion of housing part 40. More specifically, top surface 20a of base part 20 serves as the bottom surface of housing part 40. Note that in the present embodiment, the thickness direction of base part 20 is referred to as the vertical direction, and the "upper" and "lower" sides in the following description are the upper and lower sides in the vertical direction.

As illustrated in FIGS. 3 and 4, in base part 20, through holes 21, 22 and 23 extending through base part 20 from top surface 20a to bottom surface 20b in the vertical direction are formed. Contact pins 24, 25 and 26 are inserted to through holes 21, 22 and 23, respectively.

Note that while one pair of through hole 21 and contact pin 24 and one pair of through hole 22 and contact pin 25 are illustrated in FIGS. 3 and 4, multiple pairs of them are disposed in base part 20 as illustrated in FIGS. 1 and 2. In addition, while two pairs of through hole 23 and contact pin 26 are illustrated in FIGS. 2 to 4, one pair, or three or more pairs of them may be provided.

In the present embodiment, as an example, contact pin 24 has a configuration of a coaxial cable line that transmits radio frequency signals. In such a configuration, base part 20 is formed of a conductive material, and contact pin 24 is held by through hole 21 through insulating members 27a and 27b. The diameter of through hole 21 is reduced on the top surface 20a side, and insulating member 27a inserted to the portion with the reduced diameter functions as a retainer such that contact pin 24 is not removed upward from top surface 20a side.

In addition, contact pin 25 is a ground contact pin for the electric component (omitted in the drawing) housed in housing part 40, and is directly held in through hole 22. The diameter of through hole 22 is also reduced on top surface 20a side, and the portion with the reduced diameter functions as a retainer such that contact pin 25 is not removed upward from top surface 20a side.

In addition, contact pin 26 is a ground contact pin for frame part 30, and is directly held in through hole 23. The diameter of through hole 23 is also reduced on top surface 20a side, and the portion with the reduced diameter functions as a retainer such that contact pin 26 is not removed upward from top surface 20a side.

Note that the present embodiment is not limited to contact pin 24 that transmits radio frequency signals, and is applicable to other contact pins. In this case, for example, base part 20 is formed of an insulating material, and contact pin 24 is directly held in through hole 21 as with contact pins 25 and 26.

In addition, base part 20 is provided with fastening hole 28 that extends through it in the vertical direction. Fastening hole 28 is disposed to form one fastening hole together with fastening hole 33 of frame part 30 described later, fastening hole 63 of supporting part 50 and fastening hole 102 of wiring board 100 when base part 20, frame part 30, supporting part 50 and wiring board 100 are assembled with their positions match each other. Therefore, fastening holes 28, 33, 63 and 102 are formed such that the number and positions match each other. Wiring board 100 is fastened to IC socket 10 (base part 20, frame part 30 and supporting part 50) by inserting a bolt into fastening holes 28, 33, 63 and 102 and fastening it with a nut, for example.

In addition, although not illustrated in the drawings, base part 20 is provided with a positioning hole extending through it in the vertical direction. The positioning hole of base part 20 is disposed to form one positioning hole together with positioning hole 64 of supporting part 50 and the positioning hole (omitted in the drawing) of wiring board 100 when base part 20, frame part 30, supporting part 50 and wiring board 100 are assembled with their positions match each other. Therefore, the positioning holes are formed such that the number and positions match each other. Positioning pin 32 of frame part 30 described later is inserted to the positioning holes, and thus alignment of contact pin 24 and terminal 101 of wiring board 100 (electrode) can be achieved.

In addition, in base part 20, screw hole 29 to which guide member 71 described later is screw-fixed is provided along the vertical direction. While screw hole 29 extends through base part 20 as an example in the present embodiment, screw hole 29 may not extend through base part 20 as long as guide member 71 can guide supporting part 50 in the vertical direction.

In addition, the thickness in the vertical direction of base part 20 is smaller at outer part 20d than at center portion 20c where contact pin 24 is disposed. The reason for this is to increase the thickness in the vertical direction of holding member 53 that holds sheet member 51 described later. The strength of holding member 53 can be ensured by increasing the thickness in the vertical direction of holding member 53.

In addition, while guide member 71 is provided and holding member 53 is disposed in base part 20 in the present embodiment, holding member 53 may be integrated with base part 20. When holding member 53 and base part 20 are integrated with each other, the bottom surface of holding member 53 can serve as bottom surface 20b of base part 20.

Frame Part

Frame part 30 is a frame whose center portion is open in the vertical direction and the opening is surrounded. Frame part 30 constitutes the outer periphery part of housing part 40. While the shape of the opening is a rectangular shape as an example in the present embodiment, the shape may be appropriately changed in accordance with the shape of the electric component to be housed.

Guide part 31 that guides the electric component to a proper position in housing part 40 is provided at the inner periphery side of frame part 30, i.e., the inner wall of housing part 40. A publicly known technique is applicable to guide part 31 that guides the electric component to a proper position in housing part 40, and therefore the description thereof is omitted.

The electric component housed in housing part 40 by being guided by guide part 31 to a proper position in housing part 40 is pressed by a pressure component omitted in the drawing and the like. By this pressing, the terminal of the electric component is brought into pressure contact with upper contact end portions 24a and 25a of contact pins 24 and 25 described later, thus forming reliable electrical connection with terminal 101 of wiring board 100 through contact pins 24 and 25 and through electrode 61. That is, when in use, IC socket 10 houses the electric component in housing part 40, and electrically connects the housed electric component and wiring board 100 attached on the lower side of base part 20.

In addition, for alignment of contact pin 24 and terminal 101 of wiring board 100, frame part 30 is provided with a plurality of positioning pins 32 protruding downward from different locations in the bottom surface of frame part 30. While positioning pins 32 are provided at two positions on a diagonal line in frame part 30 in the present embodiment as illustrated in FIG. 2, the number and positions of positioning pins 32 may be appropriately changed as long as a plurality of positioning pins 32 is provided. Positioning pin 32 is inserted through the positioning hole of base part 20 and positioning hole 64 of supporting part 50, and inserted to the positioning hole of wiring board 100.

In addition, frame part 30 is provided with fastening hole 33 extending through it in the vertical direction. While fastening holes 33 are provided at four corners in frame part 30 in the present embodiment as illustrated in FIG. 1, the number and positions of fastening holes 33 may be appropriately changed.

Note that in the present embodiment, base part 20 and frame part 30 that constitute housing part 40 are separate members, base part 20 and frame part 30 may be formed integrally with each other. It suffices that housing part 40 can house electric components.

In addition, the electric component is an example of the first electric component, and is an IC package in the present embodiment. IC packages of a ball grid array (BGA) type, a land grid array (LGA) type and the like are applicable as the IC package, for example. In addition, wiring board 100 is an example of the second electric component, and is a wiring board of the inspection device for performing the above-described various tests in the present embodiment.

Contact Pin

Contact pins 24 and 25 are conductive pins formed of conductive material, and electrically connect the electric component and wiring board 100. When IC socket 10 is being used, upper contact end portions 24a and 25a (pin upper ends in the present invention), which are the upper contact end portions of contact pins 24 and 25, make contact with the terminal of the electric component (for example, a solder ball). In addition, lower contact end portions 24b and 25b (pin lower ends in the present invention), which are lower contact end portions of contact pins 24 and 25, make contact with through electrode 61 of sheet member 51 described later.

As described above, contact pins 24 and 25 extend through base part 20 in the vertical direction. In this manner, the electric component and wiring board 100 separated from each other in the vertical direction with base part 20 interposed therebetween are electrically connected through sheet member 51.

In addition, contact pin 26 is also a conductive pin formed of a conductive material, and electrically connects frame part 30 and wiring board 100. Upper contact end portion 26a, which is an upper contact end portion of contact pin 26, makes contact with frame part 30. When IC socket 10 is being used, lower contact end portion 26b, which is the lower contact end portion of contact pin 26, makes contact with through electrode 62 of sheet member 51 described later.

As described above, contact pin 26 extends through base part 20 in the vertical direction. In this manner, frame part 30 and wiring board 100 separated from each other in the vertical direction with base part 20 interposed therebetween are electrically connected through sheet member 51.

While the configuration of each of contact pins 24 to 26 may be, for example, a configuration in which a plunger is protruded from top and bottom openings of a cylindrical member (barrel), publicly known techniques are applicable to such a configuration, and therefore the description thereof is omitted.

Note that in the case where radio frequency signals are transmitted between the electric component and wiring board 100, it is desirable to configure contact pins 24 as coaxial lines and to shorten the length of contact pins 24 in order to match the characteristic impedance.

Contact pins 24 and 25 are provided in accordance with the configuration of the electric component to be inspected. Contact pins 24 and 25 are provided in accordance with the configurations (the number, the positions and the like) of the terminals of the electric component, and contact pin 24 includes a contact pin for power supply and a contact pin for signal transmission, for example.

Supporting Part

As described above, contact pins 24 to 26 are inserted to and held by through holes 21 to 23 formed in base part 20. As illustrated in FIGS. 3 and 4, upper contact end portions 24a and 25a of contact pins 24 and 25 are exposed upward from top surface 20a of base part 20, and are configured to make contact with the electric component when IC socket 10 is being used. In addition, as illustrated in FIGS. 3 and 4, upper contact end portion 26a of contact pin 26 is exposed upward from top surface 20a of base part 20, and makes contact with frame part 30.

As illustrated in FIG. 3, lower contact end portions 24b to 26b of contact pins 24 to 26 are exposed downward from bottom surface 20b of base part 20. In this state, lower contact end portions 24b to 26b may be damaged when wiring board 100 is attached to the bottom surface of base part 20.

For example, when wiring board 100 is attached to the bottom surface of base part 20, alignment of base part 20 and wiring board 100 is performed using a plurality of positioning pins 32. At this time, in some situation, the first positioning pin 32 is inserted to the positioning hole, wiring board 100 is rotated about the first positioning pin 32, the position is adjusted, and then the other positioning pin 32 is inserted to positioning hole. In such a case, at the time when the position of wiring board 100 is adjusted, lower contact end portion 24b of contact pin 24 may be damaged by catching lower contact end portion 24b of exposed contact pin 24 at terminal 101 of wiring board 100.

In addition, for insertion of positioning pin 32, the positioning hole of wiring board 100 is provided with an internal diameter slightly larger than the outer diameter of positioning pin 32. That is, positioning pin 32 inserted to the positioning hole can move within the range of the internal diameter of the positioning hole. As such, at the time when wiring board 100 is attached to the bottom surface of base part 20, terminal 101 may be shifted from a proper position, may be caught by lower contact end portion 24b of contact pin 24 or may push up lower contact end portion 24b in a direction inclined with respect to the vertical direction. In such a case, at the time when wiring board 100 is attached, lower contact end portion 24b may be bent or broken.

In view of this, in the present embodiment, IC socket 10 includes sheet member 51, and sheet member 51, which includes through electrodes 61 and 62, is supported by base part 20 in the state where it faces bottom surface 20b, and is configured to be movable in the vertical direction by being guided by guide member 71 described later.

Figure 5:
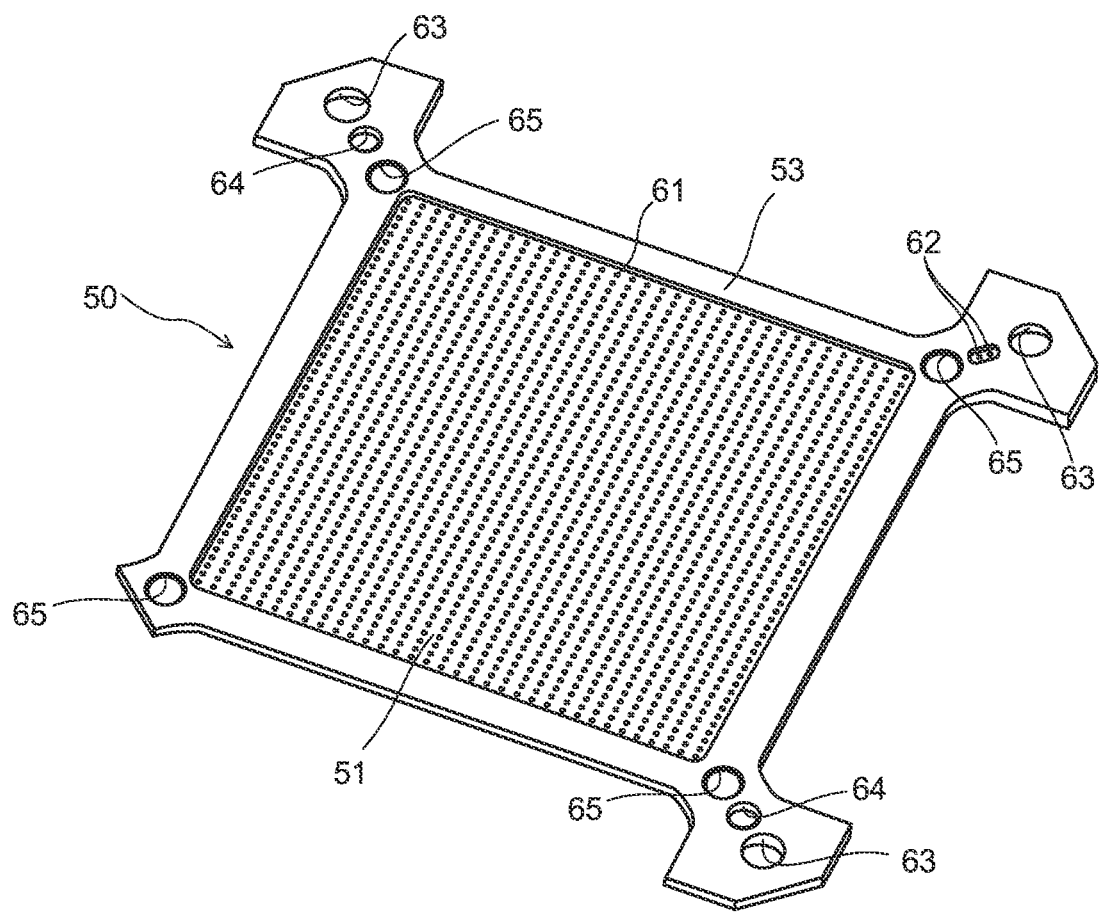
FIG. 5 is a perspective view illustrating a top surface side of a supporting part disposed at a bottom surface side of the socket illustrated in FIG. 2.
Figure 6:
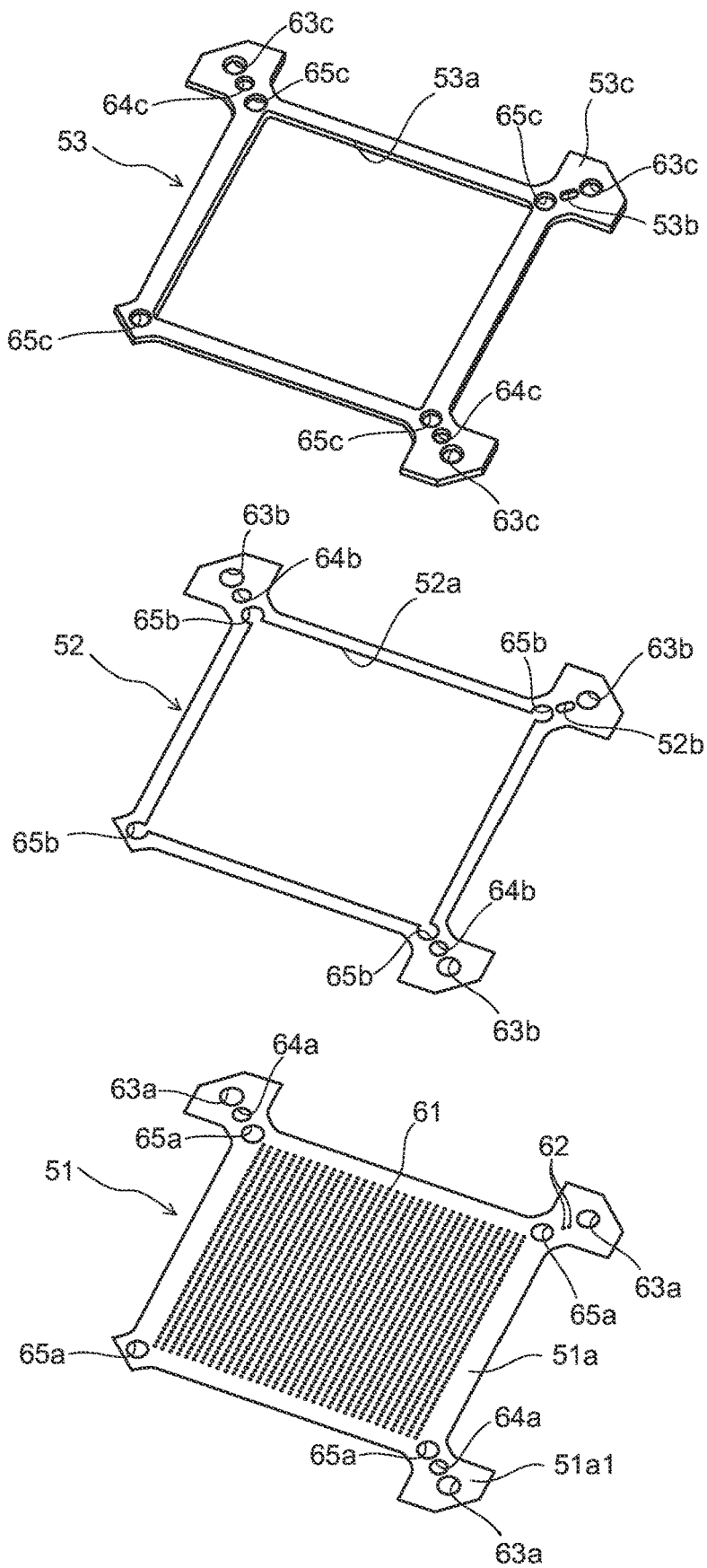
FIG. 6 is a perspective view illustrating a sheet member, a bonding member and a holding member that constitute the supporting part illustrated in FIG. 5.

Supporting part 50 including sheet member 51 is described below with reference to FIGS. 3 to 6. FIG. 5 is a perspective view illustrating the top surface side of supporting part 50 disposed on the bottom surface side of IC socket 10 illustrated in FIG. 2. FIG. 6 is a perspective view illustrating sheet member 51, bonding member 52 and holding member 53 that constitute supporting part 50 illustrated in FIG. 5.

As illustrated in FIG. 6, supporting part 50 includes sheet member 51, bonding member 52, and holding member 53 (a holding part in the present invention).

Sheet Member

Sheet member 51 is provided with through electrodes 61 and 62 extending through sheet-like sheet body 51a in the vertical direction. As illustrated in FIGS. 3 and 4, sheet member 51 is supported by base part 20 in the state where it faces bottom surface 20b, and configured to be movable in the vertical direction by being guided by guide member 71. When wiring board 100 is attached to IC socket 10, i.e., when IC socket 10 is being used, sheet member 51 is pushed up by wiring board 100.

At this time, the upper end of through electrode 61 makes contact with lower contact end portions 24b and 25b of contact pins 24 and 25, and the lower end of through electrode 61 makes contact with terminal 101 of wiring board 100, and thus, contact pins 24 and 25 and terminal 101 are electrically connected. In addition, the upper end of through electrode 62 makes contact with lower contact end portion 26b of contact pin 26 and the lower end of through electrode 62 makes contact with terminal 101 of wiring board 100, and thus, contact pin 26 and terminal 101 are electrically connected.

In this manner, when IC socket 10 is attached to wiring board 100, terminal 101 of wiring board 100 do not directly make contact with lower contact end portions 24b to 26b of contact pins 24 to 26 whose lower side is covered with sheet member 51. Therefore, when base part 20 and wiring board 100 are aligned, lower contact end portions 24b to 26b are not caught by terminal 101, and lower contact end portions 24b to 26b are not damaged.

Desirably, sheet body 51a provided with through electrodes 61 and 62 has a flexibility that allows for individual displacement of through electrodes 61 and 62. A favorable example of sheet member 51 is a flexible printed board.

Since sheet body 51a has a flexibility, through electrodes 61 and 62 can be individually displaced in the vertical direction in accordance with the contact state of terminal 101 and lower contact end portions 24b to 26b that make contact with through electrodes 61 and 62. For example, even when the thickness of terminal 101 in the vertical direction has some variation in wiring board 100, through electrodes 61 and 62 can be individually displaced in the vertical direction in accordance with the contact state with terminal 101. In this manner, the electrical connection between contact pins 24 to 26 and terminal 101 can be reliably ensured by preventing poor contact between contact pins 24 to 26 and terminal 101.

In addition, sheet member 51 is provided with fastening hole 63a corresponding to the above-described fastening hole 28 of base part 20 and fastening hole 33 of frame part 30, and positioning hole 64a corresponding to the above-described positioning hole of base part 20.

In addition, sheet member 51 is provided with insertion hole 65a for insertion of guide member 71. Insertion hole 65a is disposed at each of the four corners of sheet member 51, and is disposed on the center side than fastening hole 63a and positioning hole 64a in sheet member 51.

In the present embodiment, as an example, sheet body 51a includes protruding portion 51a1 protruding outward at four corners, and through electrode 62, fastening hole 63a, positioning hole 64a and insertion hole 65a are provided in protruding portion 51a1. As long as the electrical connection of through electrode 61 is not affected, the positions of through electrode 62, fastening hole 63a, positioning hole 64a and insertion hole 65a may be appropriately changed and the shape of sheet body 51a may also be appropriately changed.

Bonding Member

Bonding member 52 is a member for bonding sheet member 51 to holding member 53, and a double-sided tape may be used, for example. Bonding member 52 includes openings 52a and 52b corresponding to portions where through electrodes 61 and 62 are disposed, and with openings 52a and 52b, through electrodes 61 and 62 are exposed on lower contact end portions 24b to 26b side of contact pins 24 to 26.

In addition, bonding member 52 is provided with fastening hole 63b corresponding to the above-described fastening hole 28 of base part 20 and fastening hole 33 of frame part 30, and positioning hole 64b corresponding to the above-described positioning hole of base part 20. In addition, bonding member 52 is also provided with insertion hole 65b for insertion of guide member 71 as with sheet member 51.

Bonding member 52 has substantially the same shape as sheet body 51a except for openings 52a and 52b, and the shape of bonding member 52 may be appropriately changed as long as sheet member 51 can be bonded to holding member 53.

Note that in the present embodiment, for example, sheet member 51 may be welded to holding member 53 by ultrasound welding, or sheet member 51 may be fastened to holding member 53 using a fastening member such as a screw, without using bonding member 52. It suffices that sheet member 51 can be firmly fixed to holding member 53 with a tensile force so that sheet member 51 is not deflected, or not peeled off or removed from holding member 53.

Holding Member

Holding member 53 is a member that holds sheet member 51. It is preferably composed of a material, such as a metal, that has a predetermined strength (rigidity) with respect to sheet member 51 having a flexibility. Holding member 53 includes openings 53a and 53b corresponding to portions where through electrodes 61 and 62 are disposed, and with openings 53a and 53b, through electrodes 61 and 62 are exposed on lower contact end portions 24b to 26b side of contact pins 24 to 26.

As described above, in holding member 53, the thickness in the vertical direction is increased by reducing the thickness of outer part 20d of base part 20 in the vertical direction. A tensile force and a preload from wiring board 100 may be exerted on sheet member 51, but, by increasing the thickness in the vertical direction of holding member 53, the strength (rigidity) can be ensured, and deformation of holding member 53 can be prevented. In this manner, the tensile force exerted on sheet member 51 can be maintained, and even when a preload is exerted on sheet member 51 from wiring board 100, holding member 53 is less deformed. In this manner, holding member 53 can hold sheet member 51 in such a manner as to suppress the displacement of through electrodes 61 and 62 in a direction perpendicular to the vertical direction.

In addition, holding member 53 is also provided with fastening hole 63c corresponding to the above-described fastening hole 28 of base part 20 and fastening hole 33 of frame part 30, and positioning hole 64c corresponding to the above-described positioning hole of base part 20. The above-described fastening hole 63a, fastening hole 63b and fastening hole 63c constitute fastening hole 63, and the above-described positioning hole 64a, positioning hole 64b and positioning hole 64c constitute positioning hole 64.

In addition, holding member 53 is also provided with insertion hole 65c for insertion of guide member 71 as with sheet member 51. The above-described insertion hole 65a, insertion hole 65b and insertion hole 65c constitute insertion hole 65.

As illustrated in FIGS. 3 and 4, in insertion hole 65c, reduced diameter hole part 65c1 with a reduced diameter on bottom surface 20b side of base part 20 is formed. Reduced diameter hole part 65c1 is regulated by lower increased diameter part 71c of guide member 71 described later, and thus the downward movement of holding member 53, i.e., the downward movement of sheet member 51 is regulated.

Holding member 53 also has substantially the same shape as sheet body 51a except for openings 53a and 53b, and the shape of holding member 53 may be appropriately changed as long as sheet member 51 can be held.

In addition, holding member 53 may be integrated with base part 20. In the case where holding member 53 and base part 20 are integrated with each other, the bottom surface of holding member 53 may serve as bottom surface 20b of base part 20.

Guide Member

Guide member 71 that guides supporting part 50 such that supporting part 50 is movable in the vertical direction is described with reference to FIGS. 3 and 4.

As described above, holding member 53 of supporting part 50 includes insertion hole 65c to which guide member 71 is inserted, and, in insertion hole 65c, reduced diameter hole part 65c1 whose diameter is reduced on bottom surface 20b side of base part 20 is formed as illustrated in FIGS. 3 and 4.

Guide member 71 is inserted to insertion hole 65c having the above-mentioned configuration, and screw-fixed to screw hole 29 of the above-described base part 20. With guide member 71 screw-fixed to screw hole 29, supporting part 50 provided with sheet member 51 is supported by base part 20 in the state where it faces bottom surface 20b.

Guide member 71 includes screw-fixing body 71a, upper increased diameter part 71b, lower increased diameter part 71c (a regulation part in the present invention), and outer peripheral surface 71d.

Screw-fixing body 71a on the upper end side is screw-fixed to screw hole 29. The diameter of upper increased diameter part 71b is increased from screw-fixing body 71a. The diameter of lower increased diameter part 71c on the lower end side is increased from upper increased diameter part 71b. Outer peripheral surface 71d along the vertical direction is disposed between upper increased diameter part 71b and lower increased diameter part 71c.

When guide member 71 is screw-fixed to screw hole 29, the top surface of upper increased diameter part 71b makes contact with bottom surface 20b of base part 20, and thus the position of lower increased diameter part 71c with respect to bottom surface 20b is set. The downward movement of the bottom surface of reduced diameter hole part 65c1 of insertion hole 65c is regulated by the top surface of lower increased diameter part 71c. That is, lower increased diameter part 71c is disposed at the guide lower end of guide member 71.

Thus, reduced diameter hole part 65c1 is movable in the vertical direction between bottom surface 20b and the top surface of lower increased diameter part 71c. When reduced diameter hole part 65c1 moves in the vertical direction, it moves along outer peripheral surface 71d along the vertical direction, and thus supporting part 50 provided with sheet member 51 moves in the vertical direction by being guided by guide member 71.

State Transition Before and After Attaching Wiring Board

As illustrated in FIG. 3, before wiring board 100 is attached to IC socket 10, there is no wiring board 100 that pushes up supporting part 50. As a result, the bottom surface of reduced diameter hole part 65c1 is regulated by the top surface of lower increased diameter part 71c and a predetermined gap G is formed between bottom surface 20b of base part 20 and top surface 53c of holding member 53.

In the state where gap G is formed, lower contact end portions 24b to 26b of contact pins 24 to 26 are separated from through electrodes 61 and 62 of sheet member 51 and do not make contact with through electrodes 61 and 62 of sheet member 51. That is, no preload is exerted between contact pins 24 to 26 and through electrodes 61 and 62. Note that gap G is a gap with which contact pins 24 to 26 are not removed from through holes 21 to 23, and is for example, a gap with which upper contact end portions 24a to 26a are not lower than top surface 20a. With such a gap G, contact pins 24 to 26 are not removed from through holes 21 to 23.

Then, when wiring board 100 is attached to IC socket 10, a state after wiring board 100 is attached to IC socket 10 is set as illustrated in FIG. 4. In this state, terminal 101 of wiring board 100 makes contact with the lower ends of through electrodes 61 and 62 of sheet member 51, and pushes up supporting part 50 together with sheet member 51. When supporting part 50 is pushed up, top surface 53c of holding member 53 makes contact with bottom surface 20b, gap G between bottom surface 20b and top surface 53c is substantially eliminated.

In the state where gap G is substantially eliminated, lower contact end portions 24b to 26b of contact pins 24 to 26 are in contact with through electrodes 61 and 62 of sheet member 51 and pushed up. That is, a preload is exerted between contact pins 24 to 26 and through electrodes 61 and 62.

In this manner, since supporting part 50 provided with sheet member 51 is disposed to face bottom surface 20b, lower contact end portions 24b to 26b of contact pins 24 to 26 exposed from bottom surface 20b of base part 20 are not exposed to the outside of IC socket 10. Therefore, even when the position of wiring board 100 is shifted or the posture of it is tilted with respect to IC socket 10 when attaching IC socket 10 to wiring board 100, wiring board 100 does not damage lower contact end portions 24b to 26b.

In addition, in the process of attaching wiring board 100 to IC socket 10, through electrodes 61 and 62 of sheet member 51 movably guided in the vertical direction by guide member 71 push up lower contact end portions 24b to 26b in the vertical direction. Therefore, lower contact end portions 24b to 26b are not pushed up in a direction inclined with respect to the vertical direction, and lower contact end portions 24b to 26b are not bent or broken.

Through Electrode

Figure 7A:
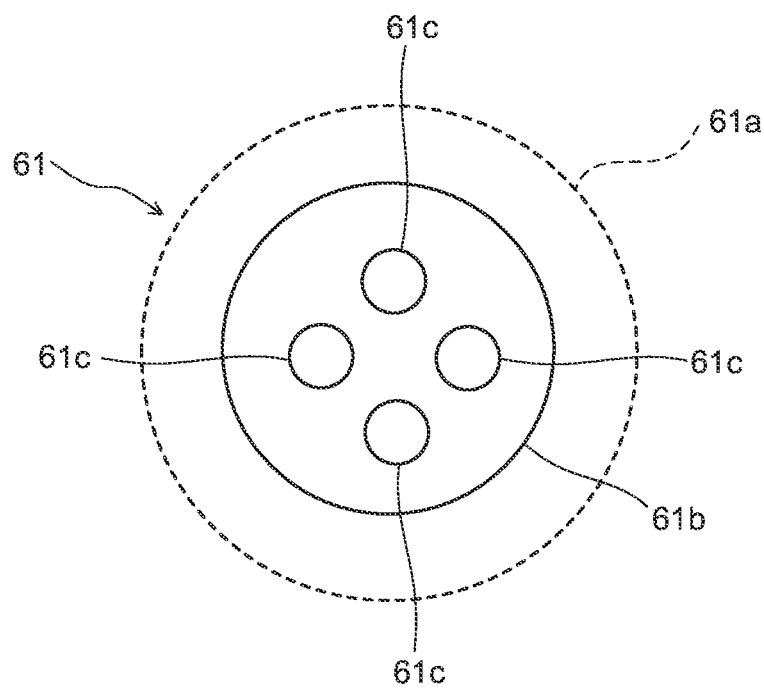
FIG. 7A is a plan view illustrating a bottom surface side of a through electrode.
Figure 7B:
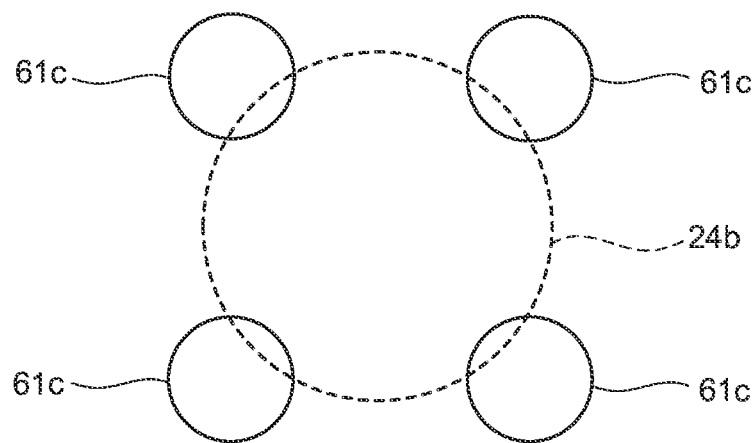
FIG. 7B is an enlarged plan view illustrating the through electrode illustrated in FIG. 7A.

Through electrodes 61 and 62 of sheet member 51 are described with reference to FIGS. 7A and 7B. FIG. 7A is a plan view illustrating the bottom surface side of through electrode 61. FIG. 7B is an enlarged plan view of through electrode 61 illustrated in FIG. 7A. Note that while the lower end 61*b* side of through electrode 61 is illustrated and described in FIGS. 7A and 7B, upper end 61*a* of through electrode 61 and through electrode 62 may have the same configurations as those of lower end 61*b* of through electrode 61 described below.

In through electrode 61, upper end 61*a* on the lower contact end portions 24*b* to 25*b* side and lower end 61*b* on the terminal 101 side may be flat surfaces in plan view of upper end 61*a* and lower end 61*b*. In addition, the sizes of upper end 61*a* and lower end 61*b* may be appropriately changed in accordance with the sizes of lower contact end portions 24*b* to 25*b* and terminal 101.

Noted that in the case where upper end 61*a* and lower end 61*b* are flat surfaces, foreign matters such as dust may be interposed, and therefore a plurality of protruding parts 61*c* may be provided as illustrated in FIGS. 7A and 7B.

In FIG. 7A, as an example, four protruding parts 61*c* protruding downward are provided at lower end 61*b* of through electrode 61 configured to make contact with terminal 101 of wiring board 100. Protruding parts 61*c* are disposed such that the spacing therebetween is equal to or greater than the size of expected foreign matters. In addition, the protruding amount of protruding part 61*c* is set to a value equal to or greater than the size of expected foreign matters. With such a protruding part 61*c*, protruding part 61*c* can ensure the electrical connection with terminal 101 even when a foreign matter enters between lower end 61*b* and terminal 101.

In addition, desirably, the plurality of protruding parts 61*c* is disposed to surround lower contact end portion 24*b* configured to make contact with upper end 61*a* in plan view of lower end 61*b* as illustrated in FIG. 7B, for example. More specifically, the plurality of protruding parts 61*c* is desirably disposed to surround lower contact end portion 24*b* in an equally dispersed manner.

After IC socket 10 is attached to wiring board 100, terminal 101 pushes up contact pins 24 and 25 via through electrode 61, and thus a preload is exerted between lower contact end portion 24*b* and terminal 101. When a preload is exerted on a single point in a concentrated manner at terminal 101, that point is recessed, which may lead to poor contact.

When the above-described plurality of protruding parts 61*c* is used, however, the preload can be dispersed, and the above-described formation of a recess can be prevented, thus preventing poor contact. In particular, when the plurality of protruding parts 61*c* is disposed in an equally dispersed manner to surround lower contact end portion 24*b*, the preload is equally dispersed and the above-described formation of a recess can be prevented, thus preventing poor contact.

Conclusion

As described above, in the present embodiment, IC socket 10 includes base part 20 in which through holes 21 to 23 are formed, contact pins 24 to 26 inserted to through holes 21 to 23, and sheet member 51. Sheet member 51 includes through electrodes 61 and 62 extending through it in the vertical direction, and is configured such that, when in use, the upper and lower ends of electrodes 61 and 62 make contact with lower contact end portions 24*b* to 26*b* of contact pins 24 to 26 and terminal 101 of wiring board 100, respectively. Sheet member 51 is supported by base part 20 in the state where it faces bottom surface 20*b* of base part 20, and sheet member 51 can move in the vertical direction by being guided by guide member 71.

According to the above-mentioned configuration of the present embodiment, supporting part 50 provided with sheet member 51 is disposed to face bottom surface 20*b*. Therefore, lower contact end portions 24*b* to 26*b* of contact pins 24 to 26 exposed from bottom surface 20*b* of base part 20 are not exposed to the outside of IC socket 10. Therefore, even when the position of wiring board 100 is shifted or the posture of it is tilted with respect to socket 10 when attaching wiring board 100 to IC socket 10, lower contact end portions 24*b* to 26*b* are not damaged.

In addition, in the process of attaching wiring board 100 to IC socket 10, through electrodes 61 and 62 of sheet member 51 guided by guide member 71 movably in the vertical direction push up lower contact end portions 24*b* to 26*b* in the vertical direction. Thus, lower contact end portions 24*b* to 26*b* are not pushed up in a direction inclined with respect to the vertical direction, and lower contact end portions 24*b* to 26*b* are not bent or broken.

In a known IC socket, the base part is composed of an upper housing on the upper side and a lower plate on the lower side as illustrated in FIG. 3 of Cited Reference 1, for example. Further, the contact pin is held by being sandwiched between the upper housing and the lower plate, such that the upper end of the contact pin is exposed from the top surface of the base part, and the lower end of the contact pin is exposed from the bottom surface of the base part. As such, in the configuration of the known IC socket, it is necessary to additionally provide a protecting member to protect the contact pin from damage.

Conversely, IC socket 10 of the present embodiment includes supporting part 50 in place of the lower plate. As described above, supporting part 50 supports contact pin 24 from the lower side, and can protect contact pin 24 from damage. That is, it is not necessary to additionally provide a member for protecting contact pin 24 from damage, and thus the cost of IC socket 10 can be reduced.

Modification

In the present embodiment, in the process of attaching wiring board 100 to IC socket 10, wiring board 100 pushes up sheet member 51 such that the above-mentioned gap G is substantially eliminated. Alternatively, before wiring board 100 is attached to IC socket 10, supporting part 50 may be attached to bottom surface 20*b* of base part 20 such that gap G is substantially eliminated. For example, in place of guide member 71, it is possible to use a fastening member for attaching supporting part 50 to bottom surface 20*b* such that gap G is substantially eliminated. In addition, guide member 71 may be omitted by integrating base part 20 and holding member 53 with each other.

In addition, in place of supporting part 50, it is possible to use a single sheet member 51, e.g., the single sheet member 51 may be attached to bottom surface 20*b* of base part 20 by an attaching method such as bonding, welding and fastening such that gap G is substantially eliminated.

The above-mentioned embodiments are merely examples of embodiments in implementing the invention, and the technical scope of the invention should not be interpreted in a limited manner by these examples. In other words, the present invention can be implemented in various ways without deviating from its gist or its main features.

INDUSTRIAL APPLICABILITY

The socket and the inspection socket according to the embodiment of the present invention are suitable for an IC socket that houses an electric component such as IC on a wiring board, for example.

REFERENCE SIGNS LIST

10 IC socket
20 Base part
20a Top surface
20b Bottom surface
21, 22, 23 Through hole
24, 25, 26 Contact pin
24a, 25a, 26a Upper contact end portion
24b, 25b, 26b Lower contact end portion
27a, 27b Insulating member
28 Fastening hole
29 Screw hole
30 Frame part
31 Guide part
32 Positioning pin
33 Fastening hole
40 Housing part
50 Supporting part
51 Sheet member
51a Sheet body
51a1 Protruding portion
52 Bonding member
52a, 52b Opening
53 Holding member
53a, 53b Opening
53c Top surface
61 Through electrode
61a Upper end
61b Lower end
61c Protruding part
62 Through electrode
63, 63a, 63b, 63c Fastening hole
64, 64a, 64b, 64c Positioning hole
65, 65a, 65b, 65c Insertion hole
65c1 Reduced diameter hole part
71 Guide member
71a Screw-fixing body
71b Upper increased diameter part
71c Lower increased diameter part
71d Outer peripheral surface
100 Wiring board
101 Terminal
102 Fastening hole

The invention claimed is:

1. An inspection socket configured to electrically connect an inspection target electric component and a wiring board, and be used for inspection of electrical characteristics of the inspection target electric component by the wiring board, the inspection socket comprising:
a base part in which a through hole extending through the base part from a top surface to a bottom surface in a vertical direction is formed;
a contact pin inserted to the through hole such that a pin lower end is exposed from the bottom surface, and configured such that, when in use, a pin upper end makes contact with the inspection target electric component; and
a sheet member disposed at the base part in a state where the sheet member faces the bottom surface, the sheet member including a through electrode extending therethrough in the vertical direction, and configured such that, when in use, an upper end of the through electrode makes contact with the pin lower end positioned above the sheet member and a lower end of the through electrode makes contact with the wiring board positioned below the sheet member,
wherein the sheet member is supported by the base part and disposed such that the sheet member is movable in the vertical direction by being guided by a guide member.

2. The inspection socket according to claim 1, wherein the guide member includes, at a guide lower end, a regulation part configured to regulate a downward movement of the sheet member.

3. The inspection socket according to claim 1, wherein the through electrode includes a plurality of protruding parts protruding downward at the lower end configured to make contact with the wiring board.

4. The inspection socket according to claim 3, wherein the plurality of the protruding parts is disposed to surround the pin lower end configured to make contact with the upper end of the through electrode in a plan view of the lower end of the through electrode.

5. An inspection socket configured to electrically connect an inspection target electric component and a wiring board, and be used for inspection of electrical characteristics of the inspection target electric component by the wiring board, the inspection socket comprising:
a base part in which a through hole extending through the base part from a top surface to a bottom surface in a vertical direction is formed;
a contact pin inserted to the through hole such that a pin lower end is exposed from the bottom surface, and configured such that, when in use, a pin upper end makes contact with the inspection target electric component; and
a sheet member disposed at the base part in a state where the sheet member faces the bottom surface, the sheet member including a through electrode extending therethrough in the vertical direction, and configured such that, when in use, an upper end of the through electrode makes contact with the pin lower end positioned above the sheet member and a lower end of the through electrode makes contact with the wiring board positioned below the sheet member,
wherein
the base part includes a plurality of the through holes;
the contact pin is inserted into each of the through holes; and
the sheet member has a flexibility that allows for an individual displacement of the plurality of the through electrodes in the vertical direction in accordance with a contact state of the plurality of the through electrodes and the wiring board when in use.

6. The inspection socket according to claim 5, further comprising a holding part configured to hold the sheet member to suppress a displacement of the through electrode in a direction perpendicular to the vertical direction.

7. An inspection socket configured to electrically connect an inspection target electric component and a wiring board, and be used for inspection of electrical characteristics of the inspection target electric component by the wiring board, the inspection socket comprising:
- a base part in which a through hole extending through the base part from a top surface to a bottom surface in a vertical direction is formed;
- a contact pin inserted to the through hole such that a pin lower end is exposed from the bottom surface, and configured such that, when in use, a pin upper end makes contact with the inspection target electric component; and
- a sheet member disposed at the base part in a state where the sheet member faces the bottom surface, the sheet member including a through electrode extending therethrough in the vertical direction, and configured such that, when in use, an upper end of the through electrode makes contact with the pin lower end positioned above the sheet member and a lower end of the through electrode makes contact with the wiring board positioned below the sheet member,
- wherein the sheet member includes an inner portion in which the through electrode is disposed and an outer portion surrounding an outer periphery of the inner portion, and
- the inspection socket further comprises:
- a holding member configured to surround an opening corresponding to the inner portion, fix the outer portion, and hold the sheet member while applying tension to the sheet member.

* * * * *